US008447007B2

(12) United States Patent
Severson

(10) Patent No.: US 8,447,007 B2
(45) Date of Patent: May 21, 2013

(54) MULTI-CLOCK REAL-TIME COUNTER

(75) Inventor: Matthew L. Severson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 65 days.

(21) Appl. No.: 13/179,852

(22) Filed: Jul. 11, 2011

(65) Prior Publication Data

US 2013/0015893 A1  Jan. 17, 2013

(51) Int. Cl.
*H03K 21/38* (2006.01)
*G06F 1/08* (2006.01)

(52) U.S. Cl.
USPC ............................................. 377/118; 327/99

(58) Field of Classification Search ........................ None
See application file for complete search history.

(56) References Cited

U.S. PATENT DOCUMENTS

| | | | |
|---|---|---|---|
| 4,855,616 A * | 8/1989 | Wang et al. | 327/145 |
| 4,914,397 A * | 4/1990 | Gale et al. | 327/115 |
| 5,550,489 A | 8/1996 | Raab | |
| 6,548,997 B1 * | 4/2003 | Bronfer et al. | 324/76.48 |
| 6,563,349 B2 * | 5/2003 | Mavila et al. | 327/99 |
| 6,809,556 B1 | 10/2004 | Bronfer et al. | |
| 7,164,296 B2 * | 1/2007 | Biswurm et al. | 327/99 |
| 7,529,531 B2 | 5/2009 | Wang et al. | |
| 2005/0083087 A1 | 4/2005 | DeMent et al. | |
| 2005/0097228 A1 | 5/2005 | Flautner et al. | |
| 2008/0244299 A1 | 10/2008 | Tune et al. | |
| 2009/0304140 A1 | 12/2009 | Hsieh | |

FOREIGN PATENT DOCUMENTS

EP  0865159 A1  9/1998

OTHER PUBLICATIONS

International Search Report and Written Opinion—PCT/US2012/046314—ISA/EPO—Nov. 16, 2011.

* cited by examiner

*Primary Examiner* — Tuan T Lam
(74) *Attorney, Agent, or Firm* — Sam Talpalatsky; Nicholas J. Pauley; Joseph Agusta

(57) ABSTRACT

A shared real-time counter is configured to provide an accurate counter output based on a fast clock period when driven by a fast clock signal or by a slow clock signal. Combinational logic circuitry provides glitch free switching between a fast clock signal input to the counter and a slow clock input to the counter. The counter is always on and increases its count by an appropriate rational number of counts representing fast clock cycles for every cycle of the fast clock while in a fast clock mode, and by an appropriate rational number of fast clock periods for every cycle of the slow clock signal while in a slow clock mode.

17 Claims, 4 Drawing Sheets

MULTI-CLOCK REAL-TIME COUNTER

FIELD OF THE DISCLOSURE

The present disclosure is in the field of digital counter circuitry and more particularly relates to multi-clock counters including glitch free switching between clocks signals.

BACKGROUND

Digital circuit designs often include counter circuitry to measure time between events by counting cycles of various clock signals or other signals in the circuit design. In complex digital systems, a real-time counter may be shared between different processing units to keep track of time. Such shared real-time counters often include highly accurate or high resolution clock signals that may be generated by a high accuracy crystal oscillator, for example.

High resolution clock signals and high accuracy crystal oscillators operate at very high frequencies and consume much more energy than lower resolution clock signals and lower accuracy oscillators operating at lower frequencies. To reduce energy consumption, digital circuits may be configured to shut off a high frequency clock signal during periods when a lower frequency clock signal is suitable for processing operations of the circuits.

Circuitry may be configured to switch certain clock signal inputs between a fast clock signal source and a slow clock signal source at various times to save energy. However, such switching between a fast clock signal and a slow clock signal can introduce inaccuracies to the output of a real-time counter that provides a count based on the switched clock signal. Therefore, systems that employ a slow clock signal during a low power mode commonly include two separate counters, a fast counter driven by the fast clock and a slow counter driven by the slow clock. When the low power mode is complete, simple arithmetic has been used based on the slow counter to advance the fast counter by the number of fast clock periods that would have passed during the low power mode. This dual-counter approach dis-advantageously involves the use of multiple counters and multiplication circuitry or software. Another disadvantage of the dual-counter approach is that a real-time count based on cycles of the fast clock may not be available during the low power mode.

SUMMARY

For a more complete understanding of the present disclosure, reference is now made to the following detailed description and the accompanying drawings. In an exemplary aspect, a shared real-time counter is configured to provide an accurate counter output based on a fast clock period when driven by a fast clock signal or by a slow clock signal. Combinational logic circuitry provides glitch free switching between a fast clock signal input to the counter and a slow clock input to the counter. The counter output increases by a first number of fast clock counts, e.g., one count, for every cycle of the fast clock while in a fast clock mode, and by an appropriate second number of fast clock counts for every cycle of the slow clock signal while in a slow clock mode, e.g. low power mode.

Aspects of the present disclosure include a method for generating a counter output of a dual mode counter. The method includes receiving a fast clock signal on a first signal path, receiving a slow clock signal on a second signal path, and receiving a clock select signal on a third signal path. The clock select signal indicates selection of either a fast clock mode or a slow clock mode. Transitions of the clock select signal are synchronized with the slow clock signal. The counter output is increased by a first counter increment for each period of the fast clock signal in response to the clock select signal indicating the fast clock mode. Otherwise, the counter output is increased by a second counter increment for each period of the slow clock signal in response to the clock select signal indicating the slow clock mode. The second counter increment represents a ratio of the period of the slow clock signal divided by the period of the fast clock signal.

Aspects of the present disclosure include a counter apparatus including register circuitry that further includes a count input path, a count output path and a counter clock input path. The circuitry also includes adder circuitry that has a first adder input path, a second adder input path and an adder output path. The adder output path is coupled to the count input path of the register circuitry and the second adder input path coupled to the count output path of the register circuitry. According to aspects of the disclosure, the apparatus further includes multiplexer circuitry having a first selectable input path, a second selectable input path, a multiplexer output path and multiplexer selector input path. The multiplexer output path is coupled to the first adder input path. The first selectable input path is coupled to a first counter increment signal, and the second selectable input path is coupled to a second counter increment signal. Glitch avoidance circuitry is configured to couple the counter clock input path to either a fast clock or a slow clock in response to a clock select signal. The glitch avoidance circuitry provides a counter increment select signal to the multiplexer selector input path in response to the clock select signal. The counter increment select signal is synchronized with the slow clock.

Further aspects of the disclosure include a counter apparatus including means for receiving a fast clock signal on a first signal path, means for receiving a slow clock signal on a second signal path, and means for receiving a clock select signal on a third signal path. The clock select signal indicates selection of either a fast clock mode or a slow clock mode. The apparatus includes means for synchronizing transitions of the clock select signal with the slow clock signal. According to aspects of the disclosure, the counter apparatus includes means for increasing an output of a counter by a first counter increment for each period of the fast clock signal in response to the clock select signal indicating the fast clock mode and means for increasing the counter output by a second counter increment for each period of the slow clock signal in response to the clock select signal indicating the slow clock mode. The second counter increment represents a ratio of the period of the slow clock signal divided by the period of the fast clock signal.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The accompanying drawings are presented to aid in the description of aspects. The drawings are provided solely for illustration of the aspects and not limitation thereof.

DETAILED DESCRIPTION

Aspects of the present disclosure provide an always-on counter that dynamically switches between a fast clock signal that is used during normal operation and a slow clock signal that can be used during low power modes of operation. The fast clock signal and slow clock signal may be unsynchronized relative to each other. During normal operation, the counter changes by a first number of counts for each fast clock cycle. During low power modes of operation, while running on the slow clock signal, the counter changes by a second number of counts for each cycle of the slow clock signal. The ratio of the second number of counts to first number of counts equals the ratio of slow clock period to fast clock period. In an example, the first number equals one so the counter changes by one count for each cycle of the fast clock signal during normal operation.

In an illustrative aspect, while the fast clock is running, the counter increments by 1 count on each rising edge of the fast clock signal (fclk_src). Just prior to entering a low power mode and shutting down the fast clock's crystal oscillator, external circuitry provides a mode change indicator. The mode change indicator may be received in the form of a state change of a clock select signal (clk_sel). The clk_sel signal is used to switch the source of the counter's clock from fclk_src to the slow clock signal (sclk_src) in a dynamic glitch free manner and to switch the value of count increments. Upon exiting the low power mode and re-starting the fclk_src crystal oscillator, the clk_sel signal is again toggled by the external circuitry to indicate a mode change. In response to the state change of the clk_sel signal, the process is reversed whereby the source of the counter's clock is switched back to fclk_src signal and the value of count increment is switched back to 1.

Figure 1:
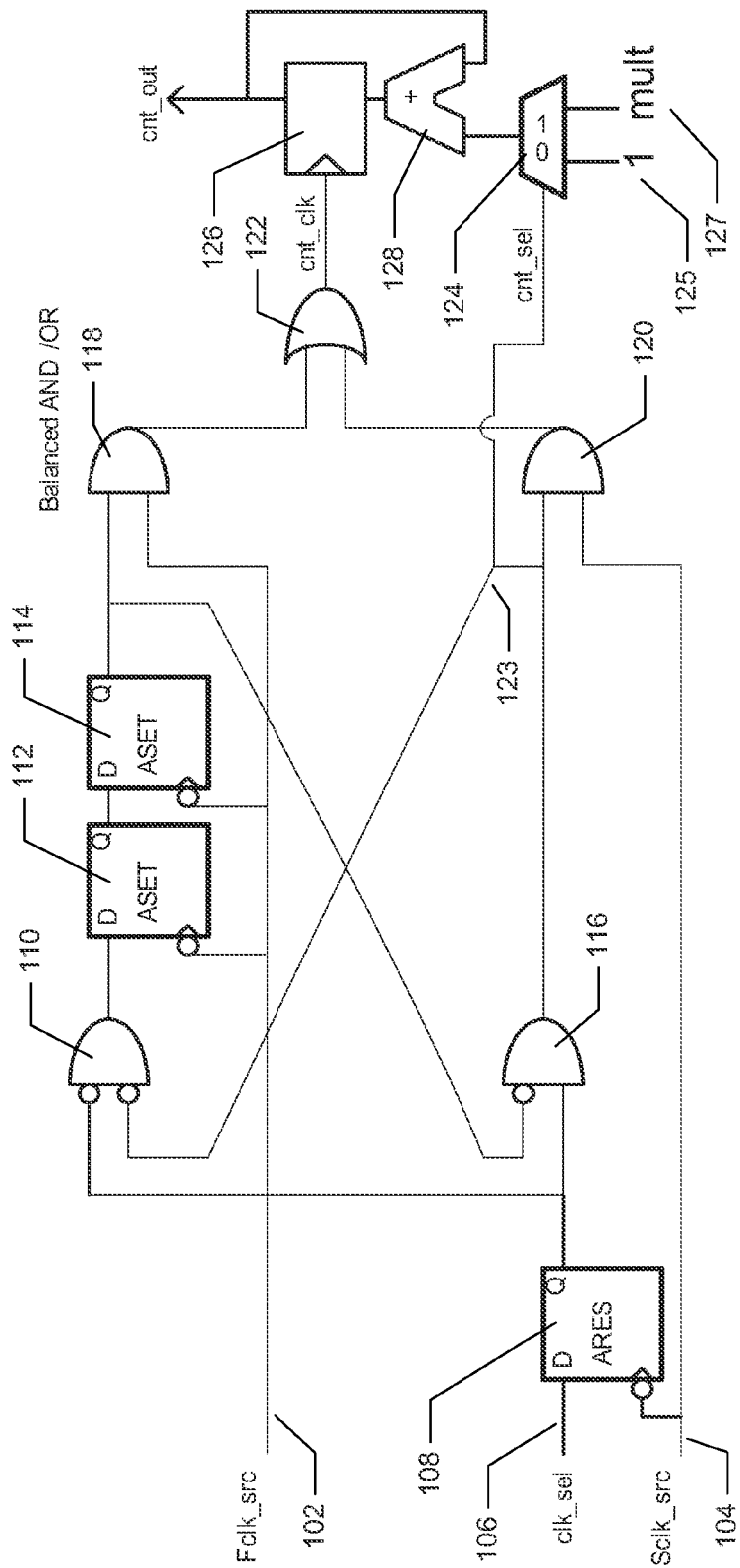
FIG. 1 is a diagram illustrating an always-on real-time counter apparatus according to an aspect of the present disclosure.

Referring to FIG. 1, an always-on real-time counter according to at least one aspect of the present disclosure is described. The real-time counter includes an fclk_src path 102, a sclk_src path 104 and a clk_sel path 106. A first flip flop 108 includes an inverted clock input coupled to the sclk_src path 104 and a data input coupled to the clk_sel path 106. A two input AND gate 110 includes two inverted inputs (thereby configured as a NAND gate). One of the inverted inputs of the AND gate 110 is coupled to an output of the first flip flop 108.

The other inverted input of the AND gate 110 is coupled to a count increment select (cnt_sel) path 123.

Output of the AND gate 110 is coupled to a data input path of a second flip flop 112. Output of the second flip flop 112 is coupled to a data input of a third flip flop 114. The second flip flop 112 and third flip flop 114 each include an inverted clock input coupled to the fclk_src path 102. Another two-input AND gate 116 includes a non-inverted input coupled to the output of the first flip flop 108 and an inverted input coupled to the output of the third flip flop 114. Output of the AND gate 116 is coupled to the cnt_sel path 123.

A two-input AND gate 118 includes one non-inverted input coupled to the output of the third flip flop 114 and another non-inverted input coupled to the fclk_src path 102. Another two-input AND gate 120 includes one non-inverted input coupled to the cnt_sel path 123 and another non-inverted input coupled to the sclk_src path 104. Outputs from the AND gate 118 and the AND gate 120 are each coupled to inputs of a two-input OR gate 122. Output of the OR gate 122 is coupled to a clock input (cnt_clk) of a register 126.

A two input multiplexer 124 includes one input coupled to a first count increment path 125 and another input coupled to a second count increment path 127. A signal select input of the multiplexer 124 is coupled to the cnt_sel path 123. A two-input adder 128 includes one input coupled to an output of the multiplexor 124 and another input coupled to an output of the register 126. Output of the adder 128 is coupled to a data input of the register 126.

According to aspects of the disclosure, the indicator (clk_sel) is synchronous with the clock (sclk_src). Internally the indicator is synchronized to the falling edge of fclk_src and used to gate-off the fclk_src after the falling edge. Also, according to aspects of the disclosure, there is no need to re-synchronize the falling edge of sclk_src because the frequency of fclk_src is generally much higher than the frequency of sclk_src. For example, glitch free operation is provided when the frequency of fclk_src is at least five times the frequency of sclk_src. This does not present a problem in practical implementations because the frequency of fclk_src will generally be in the range of 100-1000 times faster than sclk_src. Therefore, the rising edge of sclk_src should not be counted before the next rising edge of fclk_src while changing modes.

In the various aspects, no synchronous relationship is implied between the fclk_src signal and the sclk_src signal. The ratio of fclk_src frequency to sclk_src frequency may not necessarily be an integer. Therefore, in the illustrative aspects, the counter includes a fixed-point adder to keep track of fractional remainders.

Figure 2:
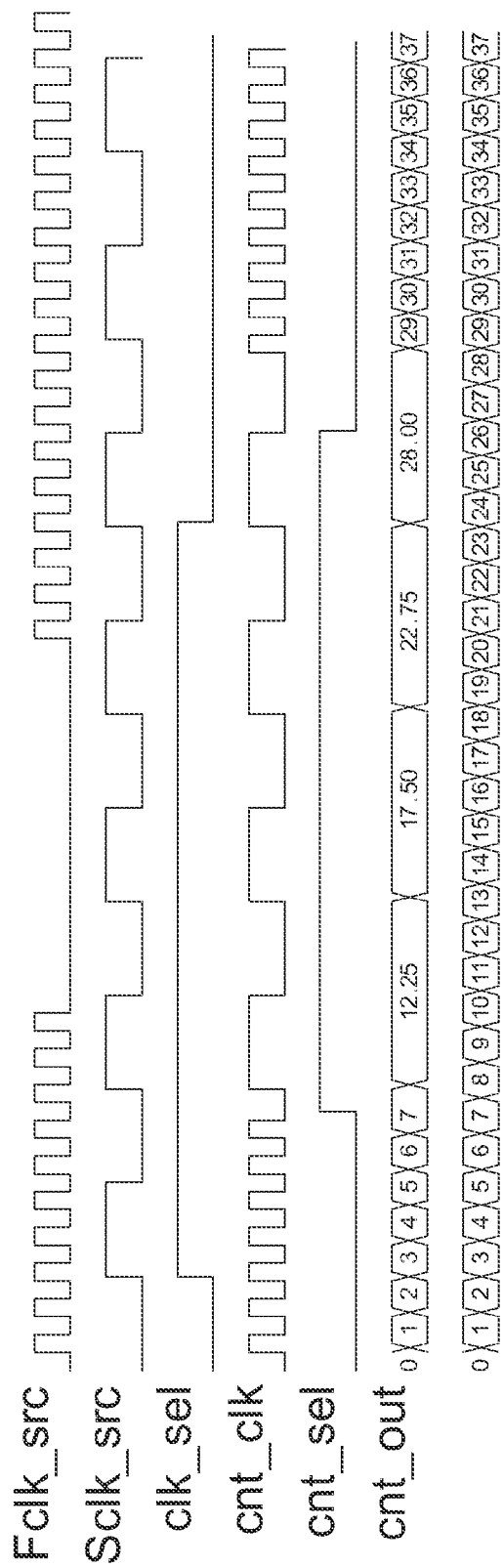
FIG. 2 is a signal timing diagram showing exemplary signal states during a glitch free switching of clock signals in the real time counter according to aspects of the present disclosure.

Operation of the real-time counter according to one example of the present disclosure is described with further reference to the signal timing diagram shown in FIG. 2 together with FIG. 1. In this example, the frequency of the fclk_src signal is 21 MHz and the frequency of the sclk_src signal is 4 MHz. Therefore the ratio (mult) of the fast clock and slow clock frequencies is 5.25. In the illustrated case, only four cycles of the sclk_src signal are counted resulting in a count value with a zero decimal portion. It should be understood that the count could also include a non-zero decimal portion in many cases.

The timing diagram shown in FIG. 2 illustrates the relative timing of signals on the various signal paths shown in FIG. 1 during a transition from normal operation, to low power mode and a transition from low power mode back to normal operation. The rows labeled fclk_src, sclk_src, clk_sel, cnt_clk, cnt_sel, and cnt_out each represent signals on their respective signal paths shown in FIG. 1. A sequence of time periods from 0 to 37 is also shown for reference along the bottom row of FIG. 2.

According to this example, in normal operation, fclk_src is coupled via the AND gate 118 and the OR gate 122 to cnt_clk which clocks the register 126. Cnt_sel is low which controls the multiplexor 124 to provide a count increment value of 1 to the adder 128. The adder adds the increment value to the last counter output to generate a next count value. Upon each rising edge of cnt_clk at the register clock input, the next count value is shifted into the register and the current count value is shifted out of the register as cnt_out.

At about time interval 2, clk_sel changes state to high indicating a signal from external circuitry to enter a low power mode. The clk_sel signal does not propagate through the first flip flop 108 until the next falling edge of sclk_src is applied to the inverted clock input to the first flip flop 108 at about time interval 5. This indication to select slow clock operation is then provided to AND gates 110 and 116 and changes input to the second flip flop 112 from high to low.

Upon the next falling edge of fclk_src which occurs at about time interval 6, a low signal state is propagated through the second flip flop 112 to the input of the third flip flop 114. Upon the next falling edge of fclk_src which occurs at about time interval 7, the low signal state is propagated through the third flip flop 114 to the AND gate 118 and the AND gate 116. The low input to the AND gate 118 shuts off the fclk_src from the OR gate 122 and ultimately from the clock input cnt_clk of register 126. At the same time, the same low signal to the inverted input of the AND gate 116 changes the output state of the AND gate 116 (cnt_sel) from low to high. This causes the multiplexer 124 to begin providing the second increment value (mult) to the adder 128. This also causes the AND gate 120 to pass the sclk_src to the OR gate 122 and ultimately to the clock input cnt_clk of the register 126.

Upon the next rising edge of sclk_src which occurs at about time interval 8, the register output cnt_out is incremented by only the first increment value '1' which had been shifted in from the adder before the fclk_src had been shut off from the register clock cnt_clk. At the same time, a next count that is incremented by the second increment value (mult) is shifted into the register 126 from the adder 128.

At about time interval 10, the external circuitry shuts off fclk_src to save energy. This does not affect the counter which by this time is incremented in response to sclk_src. The next rising edge of sclk_src occurs at about time interval 13 and is applied to the clock input cnt_clk of the register 126. This causes the register 126 to output a count incremented by the second increment value (mult), which is 5.25 in this example. In response to this same rising edge, a new count further incremented by mult (e.g. equal to mult plus cnt_out) is shifted into the register 126 from the adder 128. This is repeated upon the next rising edge of sclk_src which occurs at about time interval 18.

At about time interval 20, clk_sel changes state to low indicating a signal from external circuitry to enter a normal operating mode. The clk_sel signal does not propagate through the first flip flop 108 until the next falling edge of sclk_src is applied to the inverted clock input to the first flip flop 108 at about time interval 26. This indication to select normal operation using the fclk_src is then provided to the AND gates 110 and 116 and changes input to the second flip flop 112 from low to high.

Upon the next falling edge of fclk_src, which occurs at about time interval 27, a high signal state is propagated through the second flip flop 112 to the input of the third flip flop 114. Upon the next falling edge of fclk_src, which occurs at about time interval 28, the high signal state is propagated through the third flip flop 114 to the AND gate 118 and the AND gate 116. The high input to the AND gate 118 turns on fclk_src to the OR gate 122 and ultimately to the clock input cnt_clk of the register 126. At the same time, the same high signal to the inverted input of the AND gate 116 changes the output state of the AND gate 116 (cnt_sel) from high to low. This causes the multiplexer 124 to begin providing the first increment value ('1') to the adder 128. This also causes the AND gate 120 to turn off the sclk_src to the OR gate 122 and ultimately from the clock input cnt_clk of the register 126.

Upon the next rising edge of fclk_src, which occurs at about time interval 28, the register output cnt_out is still incremented by the second increment value (mult) that had been shifted in from the adder before the sclk_src had been shut off from the register clock cnt_clk. At the same time, a next count incremented by the first increment value ('1') is shifted into the register 126 from the adder 128.

The next rising edge of fclk_src occurs at about time interval 29 and is applied to the clock input cnt_clk of register 126. This causes the register 126 to output a count incremented by the first increment value '1'. In response to this same rising edge, a new count further incremented by '1' (e.g. equal to 1 plus cnt_out) is shifted into the register 126 from the adder 128. This is repeated upon the rising edge of each following cycle of fclk_src.

Figure 3:
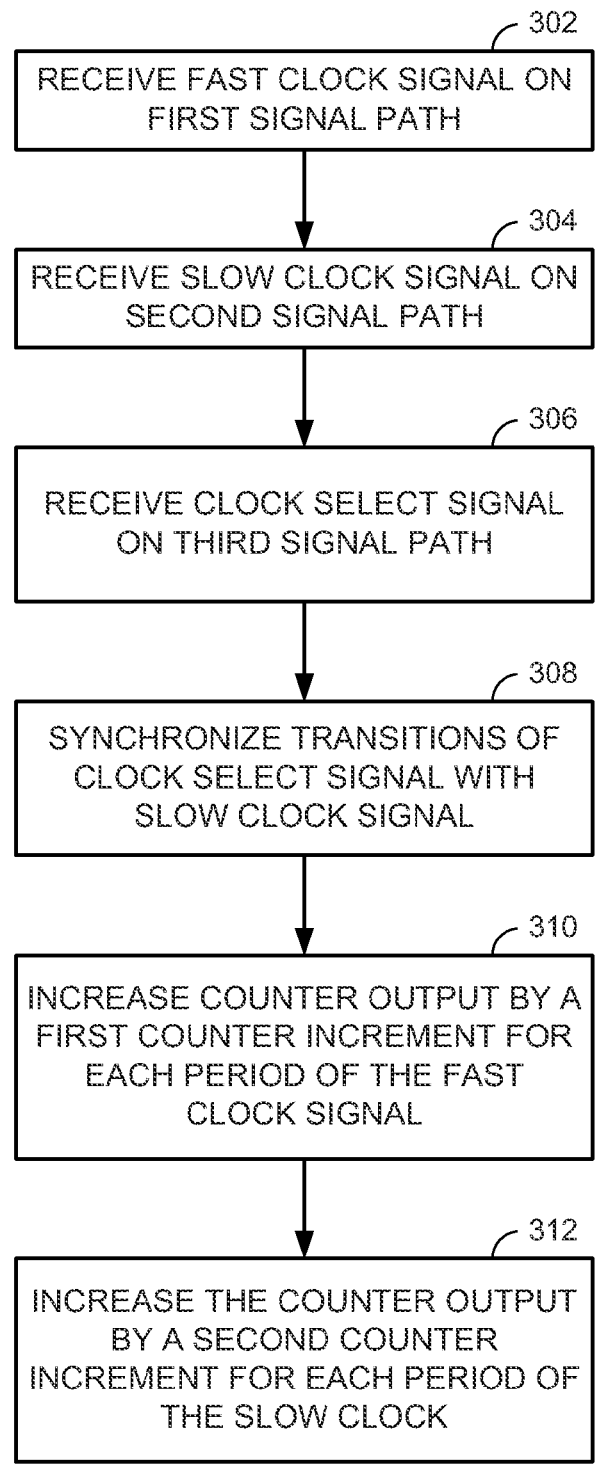
FIG. 3 is a process flow diagram showing a method for providing an always-on real-time counter according to an aspect of the present disclosure.

A method for providing an always-on real-time counter according to one aspect of the present disclosure is described with reference to FIG. 3. The method includes receiving a fast clock signal on a first signal path in block 302, receiving a slow clock signal on a second signal path in block 304, and receiving a clock select signal on a third signal path in block 306. The clock select signal indicates selection of either a fast clock mode or a slow clock mode. The method further includes synchronizing transitions of the clock select signal with the slow clock in block 308. In block 310, the method includes increasing a counter output by a first counter increment for each period of the fast clock in response to the clock select signal indicating the fast clock mode. In block 312, the method includes increasing the counter output by a second counter increment for each period of the slow clock in response to the clock select signal indicating the slow clock mode. The second counter increment equals a ratio of the period of the slow clock divided by the period of the fast clock.

Figure 4:
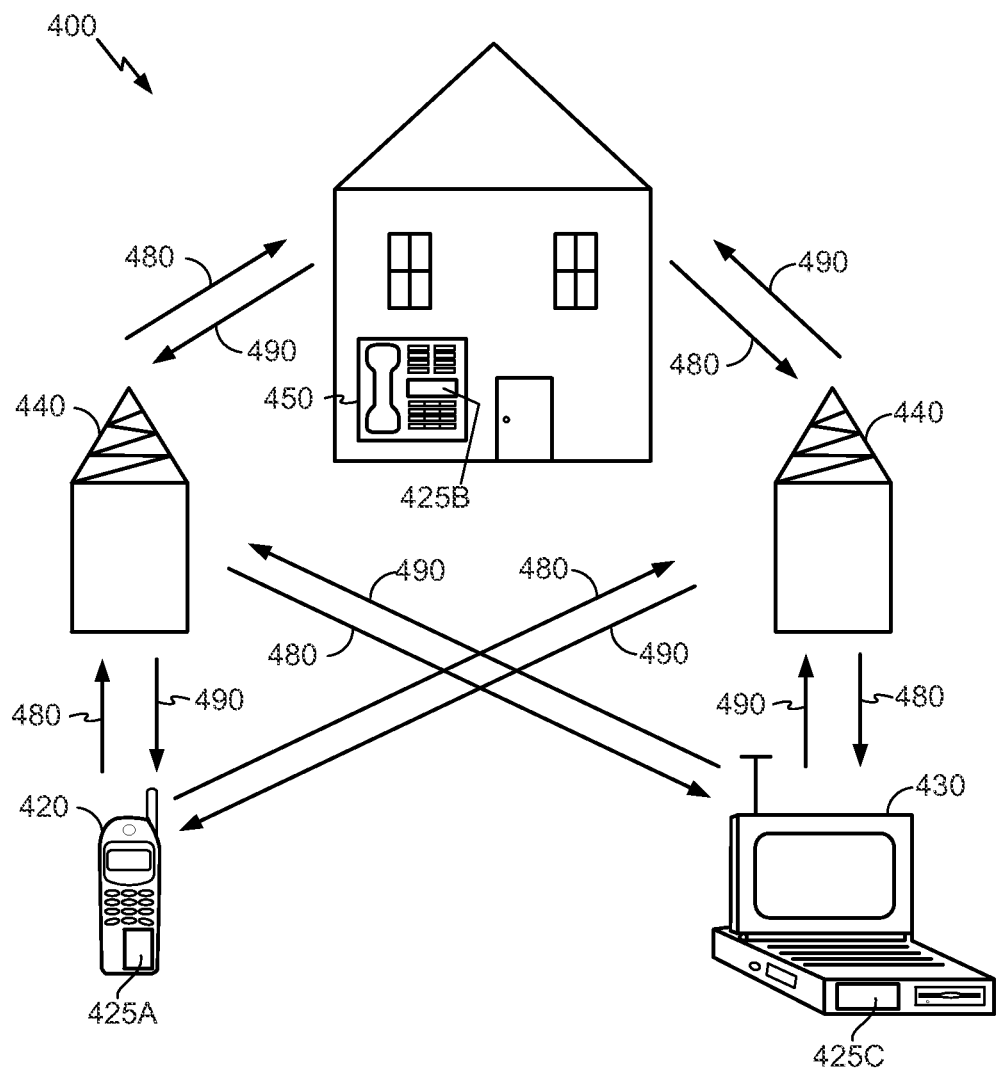
FIG. 4 is a block diagram showing an exemplary wireless communication system in which a dual-clock real-time counter may be advantageously employed according to an aspect of the present disclosure.

FIG. 4 shows an exemplary wireless communication system 400 in which an aspect of a multi-clock real-time counter may be advantageously employed according to one aspect of the present disclosure. For purposes of illustration, FIG. 4 shows three remote units 420, 430, and 450 and two base stations 440. It should be recognized that typical wireless communication systems may have many more remote units and base stations. Any of remote units 420, 430, and 450, as well as the base stations 440, may include improved clock circuitry such as disclosed herein. FIG. 4 shows forward link signals 480 from the base stations 440 and the remote units 420, 430, and 450 and reverse link signals 490 from the remote units 420, 430, and 450 to base stations 440.

In FIG. 4, a remote unit 420 is shown as a mobile telephone, a remote unit 430 is shown as a portable computer, and a remote unit 450 is shown as a fixed location remote unit in a wireless local loop system. For example, the remote units may be cell phones, hand-held personal communication systems (PCS) units, tablets, portable data units such as personal data assistants, or fixed location data units such as meter reading equipment. Although FIG. 4 illustrates certain exemplary remote units that may include an improved clock system as disclosed herein, the clock system is not limited to these exemplary illustrated units. Aspects may be suitably employed in any electronic device in which a slow clock and fast clock is desired.

Although certain aspects of the present disclosure are described in terms of particular combinations logic elements including AND gates, OR gates, flip flops and registers, for example, it should be understood that various alternative combinational logic elements including inverters, NAND gates and the like, for example be configured to provide the disclosed functionality within the scope of the present disclosure. Persons having ordinary skill in the art may select combinational logic elements best suited to a particular circuit layout to perform the disclosed functionality.

While exemplary aspects incorporating the principles of the present disclosure have been disclosed hereinabove, the present disclosure is not limited to the disclosed aspects. Instead, this application is intended to cover any variations, uses, or adaptations of the disclosure using its general principles. Further, this application is intended to cover such departures from the present disclosure as come within known or customary practice in the art to which this disclosure pertains and which fall within the limits of the appended claims.

What is claimed is:

1. A method for generating a counter output of a dual mode counter, comprising:
   receiving a fast clock signal on a first signal path;
   receiving a slow clock signal on a second signal path;
   receiving a clock selection signal on a third signal path, the clock selection signal indicating selection of one of a fast clock mode and a slow clock mode;
   synchronizing transitions of the clock selection signal with the slow clock signal;
   increasing the counter output by a first counter increment for each period of the fast clock signal, in response to the clock selection signal indicating the fast clock mode; and
   increasing the counter output by a second counter increment for each period of the slow clock signal, the second counter increment comprising a ratio of the period of the slow clock signal divided by the period of the fast clock signal in response to the clock selection signal indicating the slow clock mode.

2. The method of claim 1, further comprising:
   delaying the increasing of the counter until after a next period of the slow clock signal is received on the second signal path in response to the clock selection signal transitioning from indicating the fast clock mode to indicating the slow clock mode;
   increasing the counter output by the first counter increment for a first period of the slow clock signal after the transitioning; and
   increasing the counter by the second counter increment for a second period of the slow clock signal after the transitioning.

3. The method of claim 2, further comprising:
   gating off the fast clock signal from the counter before a next fast clock signal, in response to the clock selection signal transitioning from indicating the fast clock mode to indicating the slow clock mode.

4. The method of claim 1, further comprising:
   increasing the counter output by the second counter increment for a first period of the fast clock signal after the transitioning in response to the clock selection signal transitioning from indicating the slow clock mode to indicating the fast clock mode; and
   increasing the counter by the first counter increment for a second period of the fast clock signal after the transitioning.

5. The method of claim 1, further comprising:
   integrating the dual mode counter into at least one of a mobile phone, a set top box, a music player, a video player, an entertainment unit, a navigation device, a computer, a hand-held personal communication systems (PCS) unit, a portable data unit, and a fixed location data unit.

6. A counter apparatus comprising:
   register circuitry including a count input path, a count output path and a counter clock input path;
   adder circuitry including a first adder input path, a second adder input path and an adder output path, the adder output path coupled to the count input path of the register circuitry, and the second adder input path coupled to the count output path of the register circuitry;
   multiplexer circuitry including a first selectable input path, a second selectable input path, a multiplexer output path and multiplexer selector input path, the multiplexer output path coupled to the first adder input path, the first selectable input path coupled to a first counter increment signal, and the second selectable input path coupled to a second counter increment signal; and
   glitch avoidance circuitry configured to couple the counter clock input path to one of a fast clock or a slow clock, in response to a clock select signal, and to provide a counter increment select signal to the multiplexer selector input path, in response to the clock select signal, the counter increment select signal synchronized with the slow clock.

7. The apparatus of claim 6, integrated into at least one of a mobile phone, a set top box, a music player, a video player, an entertainment unit, a navigation device, a computer, a hand-held personal communication systems (PCS) unit, a portable data unit, and a fixed location data unit.

8. A counter apparatus comprising:
   means for receiving a fast clock signal on a first signal path;
   means for receiving a slow clock signal on a second signal path;
   means for receiving a clock selection signal on a third signal path, the clock selection signal indicating selection of one of a fast clock mode and a slow clock mode;
   means for synchronizing transitions of the clock selection signal with the slow clock signal;
   means for increasing an output of a counter by a first counter increment for each period of the fast clock signal in response to the clock selection signal indicating the fast clock mode; and
   means for increasing the counter output by a second counter increment for each period of the slow clock signal in response to the clock selection signal indicating the slow clock mode, the second counter increment comprising a ratio of the period of the slow clock signal divided by the period of the fast clock signal.

9. The apparatus of claim 8, comprising:
   means for delaying the increasing of the counter until after a next period of the slow clock signal is received on the second signal path in response to the clock selection signal transitioning from indicating the fast clock mode to indicating the slow clock mode;
   means for increasing the counter output by the first counter increment for a first period of the slow clock signal after the transitioning; and means for increasing the counter by the second counter increment for a second period of the slow clock signal after the transitioning.

10. The apparatus of claim 9, further comprising:
means for gating off the fast clock signal from the counter before a next fast clock signal in response to the clock selection signal transitioning from indicating the fast clock mode to indicating the slow clock mode.

11. The apparatus of claim 8, further comprising:
means for increasing the counter output by the second counter increment for a first period of the fast clock signal after the transitioning in response to the clock selection signal transitioning from indicating the slow clock mode to indicating the fast clock mode; and
means for increasing the counter by the first counter increment for a second period of the fast clock signal after the transitioning.

12. The apparatus of claim 8, integrated into at least one of a mobile phone, a set top box, a music player, a video player, an entertainment unit, a navigation device, a computer, a hand-held personal communication systems (PCS) unit, a portable data unit, and a fixed location data unit.

13. A method for generating a counter output of a dual mode counter, comprising the steps of:
receiving a fast clock signal on a first signal path;
receiving a slow clock signal on a second signal path;
receiving a clock selection signal on a third signal path, the clock selection signal indicating selection of one of a fast clock mode and a slow clock mode;
synchronizing transitions of the clock selection signal with the slow clock signal;
increasing the counter output by a first counter increment for each period of the fast clock signal in response to the clock selection signal indicating the fast clock mode; and
increasing the counter output by a second counter increment for each period of the slow clock signal in response to the clock selection signal indicating the slow clock mode, the second counter increment comprising a ratio of the period of the slow clock signal divided by the period of the fast clock signal.

14. The method of claim 13, further comprising the steps of:
delaying the increasing of the counter until after a next period of the slow clock signal is received on the second signal path in response to the clock selection signal transitioning from indicating the fast clock mode to indicating the slow clock mode;
increasing the counter output by the first counter increment for a first period of the slow clock signal after the transitioning; and
increasing the counter by the second counter increment for a second period of the slow clock signal after the transitioning.

15. The method of claim 14, further comprising the step of:
gating off the fast clock signal from the counter before a next fast clock signal, in response to the clock selection signal transitioning from indicating the fast clock mode to indicating the slow clock mode.

16. The method of claim 13, further comprising the steps of:
increasing the counter output by the second counter increment for a first period of the fast clock signal after the transitioning in response to the clock selection signal transitioning from indicating the slow clock mode to indicating the fast clock mode; and
increasing the counter by the first counter increment for a second period of the fast clock signal after the transitioning.

17. The method of claim 13, further comprising the step of:
integrating the dual mode counter into at least one of a mobile phone, a set top box, a music player, a video player, an entertainment unit, a navigation device, a computer, a hand-held personal communication systems (PCS) unit, a portable data unit, and a fixed location data unit.

* * * * *